(12) United States Patent
Verdy

(10) Patent No.: US 11,711,988 B2
(45) Date of Patent: Jul. 25, 2023

(54) ELEMENTARY CELL COMPRISING A RESISTIVE MEMORY AND ASSOCIATED METHOD OF INITIALIZATION

(71) Applicant: COMMISSARIAT À L'ENERGIE ATOMIQUE ET AUX ENERGIES ALTERNATIVES, Paris (FR)

(72) Inventor: Anthonin Verdy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 65 days.

(21) Appl. No.: 17/123,643

(22) Filed: Dec. 16, 2020

(65) Prior Publication Data

US 2021/0184117 A1    Jun. 17, 2021

(30) Foreign Application Priority Data

Dec. 16, 2019   (FR) ........................................ 1914468

(51) Int. Cl.
*H10N 70/00*   (2023.01)
*H10B 63/00*   (2023.01)
*H10N 70/20*   (2023.01)

(52) U.S. Cl.
CPC .......... *H10N 70/841* (2023.02); *H10B 63/00* (2023.02); *H10N 70/021* (2023.02); *H10N 70/063* (2023.02); *H10N 70/231* (2023.02); *H10N 70/8845* (2023.02)

(58) Field of Classification Search
CPC ............................. H01L 45/149; H10B 63/00
See application file for complete search history.

(56) References Cited

U.S. PATENT DOCUMENTS

| | | | |
|---|---|---|---|
| 2010/0091561 A1* | 4/2010 | Lowrey | G11C 13/0004 326/39 |
| 2010/0163825 A1 | 7/2010 | Dennison et al. | |
| 2011/0310653 A1 | 12/2011 | Kreupl et al. | |

OTHER PUBLICATIONS

Search Report as issued in French Patent Application No. 1914468, dated Oct. 7, 2020.

* cited by examiner

*Primary Examiner* — Moazzam Hossain
*Assistant Examiner* — Hajar Kolahdouzan
(74) *Attorney, Agent, or Firm* — Pillsbury Winthrop Shaw Pittman LLP

(57) ABSTRACT

An aspect of the invention relates to an elementary cell that includes a breakdown layer made of dielectric having a thickness that depends on a breakdown voltage, a device and a non-volatile resistive memory mounted in series, the device including an upper selector electrode, a lower selector electrode, a layer made in a first active material, referred to as active selector layer, the device being intended to form a volatile selector; the memory including an upper memory electrode, a lower memory electrode, a layer made in at least one second active material, referred to as active memory layer.

15 Claims, 7 Drawing Sheets

_US 11,711,988 B2_

ELEMENTARY CELL COMPRISING A RESISTIVE MEMORY AND ASSOCIATED METHOD OF INITIALIZATION

CROSS-REFERENCE TO RELATED APPLICATIONS

This application claims priority to French Patent Application No. 1914468, filed Dec. 16, 2019, the entire content of which is incorporated herein by reference in its entirety.

FIELD

The technical field of the invention is that of elementary cells that comprise a resistive memory in series with a selector device.

The present invention relates to an elementary cell that comprises a resistive memory in series with a device intended to form a selector. The present invention also relates to a method for initialising such a cell.

BACKGROUND

For applications that require a storage of the information resistant to power cuts, rewritable non-volatile resistive memories are commonly used. The latter are based on active materials such as ion conducting (CBRAM or "Conductive Bridging RAM" memories), metal oxides (OxRAM or "Oxide Resistive RAM" memories), ferroelectric (FERAM or "Ferroelectric RAM" memories), magnetic (MRAM or "Magnetic RAM memories), spin transfer magnetic (STTRAM or "Spin Torque Transfer RAM" memories) or phase change (PCRAM or "Phase Change RAM" memories) materials. These memories are memories of the resistive type, i.e. they can have at least two resistive states corresponding to a high resistance state ("HRS" state for "High Resistance State") and to a low resistance state ("LRS" state for "Low Resistance State") under application of a voltage.

Resistive memories need two electrodes to operate. For example, CBRAM memories comprise an active zone based on an ion conducting material forming a solid electrolyte with ion conduction arranged between an electrode forming an inert cathode and an electrode comprising a portion of ionisable metal, i.e. a portion of metal that can easily form metal ions, and forming an anode. The operation of CBRAM memories is based on the formation, within the solid electrolyte, of one or several metal filaments (also called "dendrites") between its two electrodes when these electrodes are brought to suitable potentials. The formation of the filament makes it possible to obtain a given electrical conduction between the two electrodes. By modifying the potentials applied to the electrodes, it is possible to modify the distribution of the filament, and to thus modify the electric conduction between the two electrodes.

PCRAM memories comprise an active zone based on a chalcogenide material. The operation of PCRAM memories is based on the phase transition of the chalcogenide material, induced by the heating of this material under the effect of specific electrical pulses applied between the two electrodes. This transition is done between a crystalline phase, ordered, of low resistance and thermodynamically stable and an amorphous phase, disordered, of high resistance and thermodynamically unstable.

OxRAM memories have an M-I-M (Metal-Insulator-Metal) structure that comprises an active material of variable electrical resistance, in general a transition metal oxide (ex. $HfO_2$, $Ta_2O_5$, $TiO_2$ . . . ), arranged between two metal electrodes. The passage from the "HRS" state to the "LRS" state is governed by the formation and the rupture of a conductor filament with nanometric section between the two electrodes.

Resistive memories in particular have the interest of being able to be integrated with high densities, via an integration of the "cross-bar" type (also designated by the term "cross-point").

FIG. 1 Such an architecture 200 is shown in FIG. 1 and comprises a plurality of access lines 201, 202, 203, 204 and a plurality of rewritable non-volatile memory cells (here four cells C11, C21, C22, C12) based on active materials (for example CBRAM cells). The access lines are formed by upper parallel bit lines 201, 202 and lower word lines 203, 204 perpendicular to the bit lines, the elementary cells C11, C21, C22, C12 being sandwiched at the intersection between the bit lines 201, 202 and the word lines 203, 204. The architecture 200 thus forms a network where each memory cell can be addressed individually, by selecting the correct bit line and the correct word line.

In order to avoid the parasitic leakage currents that pass through the adjacent cells during the reading phase of the state of a cell realized by polarisation of the desired line and column, it is known to add a selector device in series with each one of the cells. In this case, the selector devices block the passage of the parasitic current, thus authorising solely the current induced by the polarisation of the bit line and the word line (application of a difference in potential Vbias between these two lines).

In literature, there are different types of selector devices such as FAST (for "Field Assisted Superlinear Threshold"), MIEC (for "Mixed-Ionic-Electronic Conduction") and OTS (for "Ovonic Threshold Switching"). A selector device is composed of two electrodes and of an active material, the electrodes being arranged on either side of the active material and making it possible to apply a voltage to this active material. In the case of a selector of the OTS type, the active material can be a chalcogenide alloy, generally in an amorphous state.

[FIG. 2] The basic principle of the operation of a selector device is shown in FIG. 2. The device is highly resistant in the OFF state. As soon as a voltage is applied to it that is greater than a threshold voltage, the current increases rapidly to reach the ON state of the device, a lowly resistive state. As soon as the current or the voltage is reduced below a specific value referred to as maintaining or holding, the device becomes OFF again.

To decrease the threshold voltage of a selector device, it can be possible to decrease the thickness of the layer of active material of the selector or to modify the composition of the active material, in particular by decreasing the width of its bandgap and therefore the energy of the associated band. The decrease in the bandwidth can be done by using heavy atoms such as Sb, Si, Sn or Te which have the disadvantage of decreasing the crystallisation temperature of the material. When the crystallisation temperature is less than the integration temperatures, the active material crystallises and is in a low resistance state or conductive state after the manufacturing process and therefore does not play its role of selector consisting of preventing the passing of parasitic currents, i.e. electrically insulating the memory.

There is therefore a need to obtain an assembly that comprises a resistive memory and a selector device, wherein the memory is electrically insulated, regardless of the resistive state of the memory and the resistive state of the selector device after the manufacturing process.

SUMMARY

An aspect of the invention offers a solution to the problems mentioned hereinabove, by making it possible to obtain a cell with a resistive memory in series with a selector device without any problem of electrical insulation of the memory starting from after the manufacturing process.

A first aspect of the invention relates to an elementary cell comprising a device and a non-volatile resistive memory mounted in series, the device comprising:
an upper selector electrode,
a lower selector electrode,
a layer made in a first active material, referred to as active selector layer, said device being intended to form a volatile selector switching from a first selector resistive state to a second selector resistive state by application of a selector threshold voltage between the upper selector electrode and the lower selector electrode and switching back to the first selector resistive state as soon as the current passing through it or the voltage at the terminals of the upper selector electrode and the lower selector electrode again become respectively less than a holding current or voltage, the first selector resistive state being more resistive than the second selector resistive state,
said memory comprising:
an upper memory electrode,
a lower memory electrode,
a layer made in at least one second active material, referred to as active memory layer,
said memory switching from a first resistive memory state to a second resistive memory state by application of a memory threshold voltage between the upper memory electrode and the lower memory electrode,
said cell further comprising a breakdown layer of dielectric material mounted in series with the device and the memory, having a thickness that allows for the breakdown of the breakdown layer at a predetermined breakdown voltage when said breakdown voltage is applied between the upper memory electrode and the lower selector electrode.

Thanks to the invention, the insulating breakdown layer plays the role of the selector after the manufacturing process, i.e. it carries out the electrical insulation of the memory regardless of its resistive state after the manufacturing process. The thickness of the breakdown layer is chosen to allow for the breakdown thereof during the application of a predetermined breakdown voltage. The breakdown layer then stops being resistive and playing the role of selector.

The term "breakdown layer" means a layer made from an electrically insulating material intended to become at least partially conductive upon the application of a minimum electrical voltage, called breakdown voltage.

The first selector resistive state corresponds to the OFF state of the selector device, the second selector resistive state corresponds to the ON state of the selector device and the first and the second memory resistive states correspond to the HRS and LRS states of the resistive memory, defined hereinabove.

In addition to the characteristics that have just been mentioned in the preceding paragraph, the cell according to the first aspect of the invention can have one or more additional characteristics among the following, taken individually or according to any technically permissible combinations.

According to an alternative embodiment, the thickness of the breakdown layer is the ratio of the breakdown voltage and of a breakdown field of the dielectric material of the breakdown layer.

Thus, the thickness of the breakdown layer depends on the dielectric material that comprises it.

According to an alternative embodiment compatible with the preceding alternative embodiment, the breakdown voltage is between a reading voltage chosen greater than the selector threshold voltage and the memory threshold voltage, and a programming voltage at least equal to the sum of the selector threshold voltage and of the memory threshold voltage.

Thus, the breakdown voltage is sufficient to break down the breakdown layer and to initialise the memory without damaging it.

According to an alternative embodiment compatible with the preceding alternative embodiments, the device is intended to form a selector of the OTS type.

According to an alternative embodiment compatible with the preceding alternative embodiments, the resistive memory is of the PCRAM, OxRAM or CBRAM type.

According to an alternative embodiment compatible with the preceding alternative embodiments, the active selector layer is in a crystalline conductive state.

Thus, in the case where the material of the active selector layer has a crystallisation temperature that is lower than the integration temperatures, the selector device is in a conductive state after the manufacturing process and therefore does not play its role of selector consisting of electrically insulating the memory.

According to an alternative embodiment compatible with the preceding alternative embodiments, the upper selector electrode is confounded with the lower memory electrode.

According to an alternative embodiment compatible with the preceding alternative embodiments except for the preceding alternative embodiment, the breakdown layer is formed between the lower memory electrode and the upper selector electrode.

According to an alternative embodiment compatible with the preceding alternative embodiments except for the preceding alternative embodiment, the cell further comprises an upper cell electrode and/or a lower cell electrode and the breakdown layer is formed between the upper cell electrode and the upper memory electrode or between the lower cell electrode and the lower selector electrode.

Thus, the breakdown layer is not directly in contact with the active selector layer or with the active memory layer and therefore does not induce dispersion of the properties of the memory or of the selector device.

According to an alternative embodiment compatible with the preceding alternative embodiments, the cell comprises a carbon layer between the lower selector electrode and the active selector layer and/or between the upper selector electrode and the active selector layer.

Thus, the interaction between the active selector layer and its electrodes is limited and the endurance of the selector device is improved.

A second aspect of the invention relates to a matrix comprising a plurality of cells according to the first aspect of the invention, a plurality of upper access lines and a plurality of lower access lines, each cell being located at an intersection between an upper access line and a lower access line allowing for the individual addressing thereof, the neighbouring cells of the addressed cell being subjected to a residual voltage coming from the addressed cell.

Thus, the cell according to the first aspect of the invention is compatible with a structure with high integration density.

A third aspect of the invention relates to a method of initialising a cell according to the first aspect of the invention or of each cell of a matrix according to the second aspect of the invention, including a step of applying to the cell an initialisation current and a voltage pulse having an intensity equal to the breakdown voltage.

Thus, the intensity of the initialisation pulse makes possible on the one hand the breakdown of the breakdown layer which becomes conductive and therefore no longer plays the role of selector, and on the other hand the initialisation of the memory.

According to an alternative embodiment, if the active selector layer is in a crystalline conductive state, the pulse has a predetermined fall time and the initialisation current has a predetermined value.

Thus, the current applied during the initialisation or initialisation current is chosen to allow for the melting of the active selector layer and the fall time of the pulse is chosen to allow for the quench of the active selector layer, which allows for the amorphization of the selector device in order to place the selector device in its high resistance state OFF. The selector device then plays the role of a selector starting from initialisation.

According to an alternative embodiment compatible with the preceding alternative embodiment, the breakdown voltage is between a minimum breakdown voltage equal to the maximum voltage between the reading voltage and the residual voltage, and a maximum breakdown voltage equal to the programming voltage.

Thus, the breakdown voltage takes account of any residual voltages within the matrix.

The invention and its various applications shall be understood better when reading the following description and when examining the figures that accompany it.

BRIEF DESCRIPTION OF THE FIGURES

The figures are presented for the purposes of information and in no way limit the invention.

DETAILED DESCRIPTION

Unless mentioned otherwise, the same element that appears in different figures has a unique reference.

Figure 1:
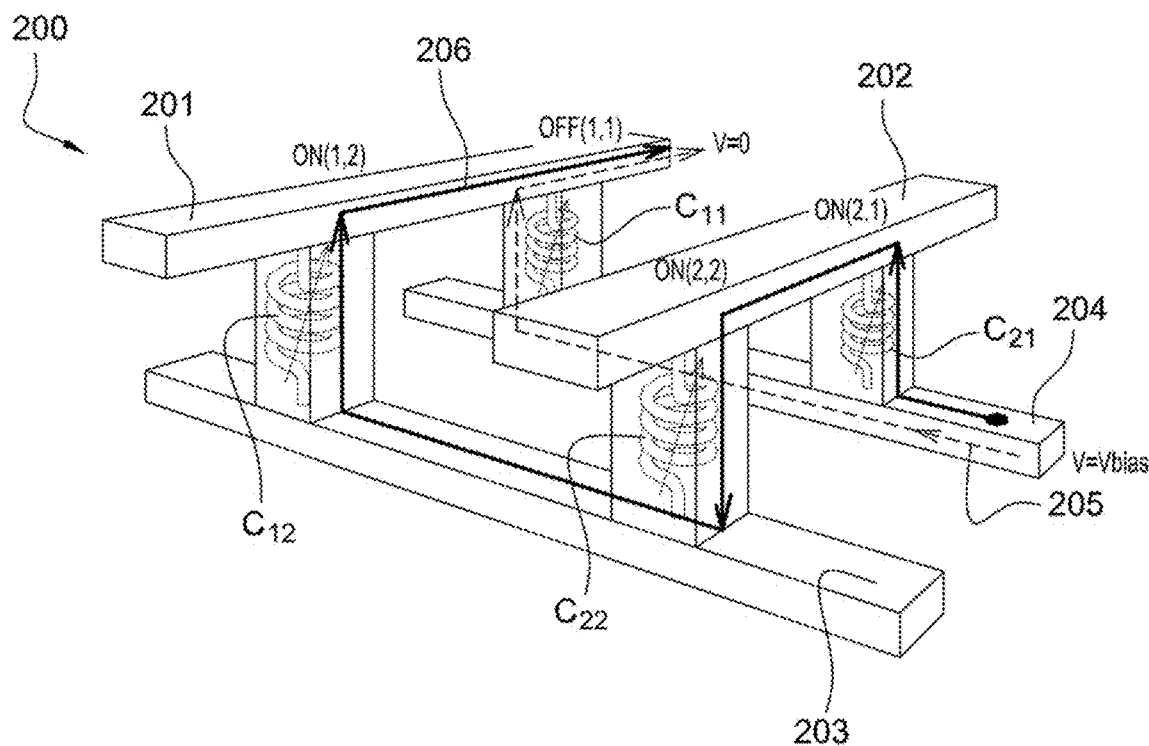
FIG. 1 shows an addressing architecture of a plurality of memory cells according to the prior art.
Figure 2:
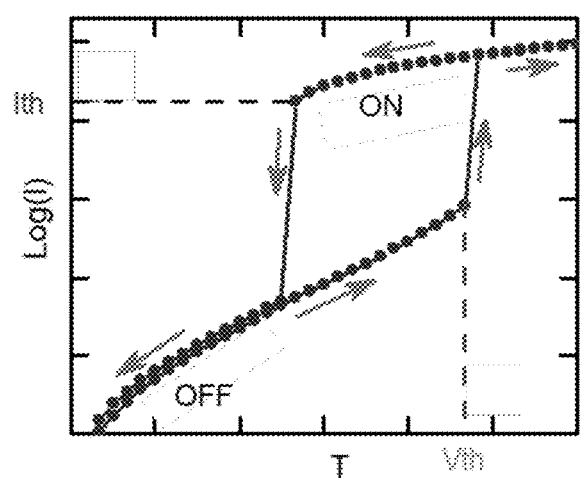
FIG. 2 shows a graph explaining the operating principle of a selector device.

FIGS. 1 and 2 have already been described in reference to the prior art.

Figure 3:
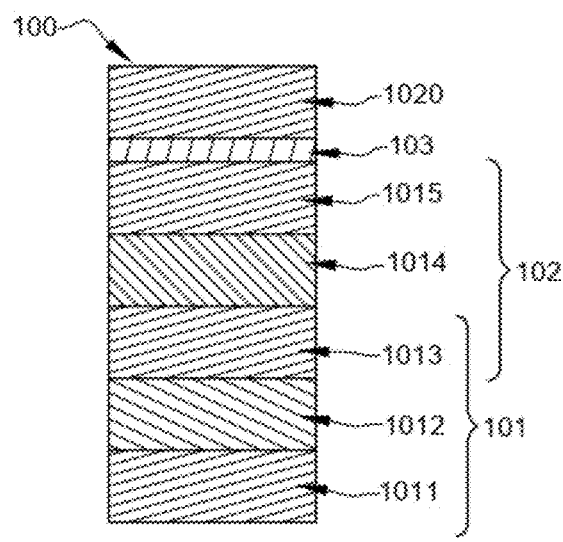
FIG. 3 diagrammatically shows an elementary cell according to the first aspect of the invention.

[FIG. 3] A first aspect of the invention shown in FIG. 3 relates to an elementary cell 100 that comprises a stack comprising a selector and a non-volatile resistive memory 102. The selector allows for the addressing of the non-volatile resistive memory 102 when it is integrated within an architecture of the cross-bar type.

The elementary cell 100 comprises:
A layer of conductive material of lower selector electrode 1011;
A layer made in a first active material, referred to as active selector layer 1012;
A layer of conductive material, forming an upper selector electrode and a lower memory electrode;
A layer made in at least one second active material, referred to as active memory layer 1014;
A layer of conductive material of upper memory electrode 1015;
A breakdown layer 103 made in a dielectric material.

According to the embodiment shown in FIG. 3, the layer of conductive material of upper selector electrode and the layer of conductive material of lower memory electrode are confounded in a single layer 1013 but it is also possible to have two separate layers to form these elements.

The first active material is intended to form a selector device 101 and the at least one second active material is able to form a resistive memory 102, the selector device 101 and the resistive memory 102 each requiring an upper electrode and a lower electrode to ensure the operation thereof.

An upper electrode of a device is defined as the electrode located above this device and the lower electrode of a device as the electrode located below this device, the electrodes being located on either side of the device. It will be appreciated that the adjectives "upper" and "lower" are here with respect to the orientation of the assembly including the upper electrode, the device and the lower electrode to the extent that by turning over this assembly, the electrode qualified hereinabove as upper becomes the lower electrode and the electrode qualified hereinabove as lower becomes the upper electrode.

The material or materials of the active memory layer 1014 are chosen according to the type of memory desired, for example, a memory of the PCRAM, OxRAM or CBRAM type: this choice then conditions the choice of the conductive materials of the electrodes 1013, 1015 of the memory 102. Indeed, for example, for a CBRAM to operate, it needs two electrodes arranged on either side of its ion conducting active material, of which one electrode comprising a portion of ionisable metal, i.e. a portion of metal that can easily form metal ions. The electrodes are for example made from Ag or Cu.

For a PCRAM memory, the material of the active memory layer 1014 is for example made from In—Ge—Sb—Te, Ga—Sb, Ge—Sb, Ga—Sb—Te, Ti—Sb—Te, Ge—Sb—Se—Te, Si—Sb—Te, Ge—Sb—Te, Sb—Te or Ge—Te. The thickness of the active memory layer 1014 is for example between 50 and 100 nm.

For a CBRAM memory, the material of the active memory layer 1014 is for example Ge—S, Ge—Se, Cu—S, Ag—S, Ta—O, Si—O, W—O.

The active memory layer 1014 can include for example a first sublayer of $Al_2O_3$ and a second sublayer of Cu—Te—Ge. The first sublayer has for example a thickness of 3.5 nm and the second sublayer has for example a thickness of 20 nm.

For an OxRAM memory, the material of the active memory layer 1014 is for example Hf—O, Ta—O, Ti—O, Al—O.

The active memory layer 1014 can comprise for example a first sublayer of $HfO_2$ and a second sublayer of Ti. The first sublayer has for example a thickness of 5 to 10 nm and the second sublayer has for example a thickness of 5 to 10 nm.

Before initialisation, i.e. after the manufacturing process, the active selector layer 1012 is, for example, in a crystalline conductive state, i.e. in a low resistance state.

The material of the active selector layer 1012 is for example chosen so that the selector device 101 to be formed is of the OTS type. For example, the active selector layer 1012 is made from Ge—Se, As—Te—Al, Ge—Se—Te, Ge—Se—Sb, As—Ge—Te, As—Ge—Te—Si, Si—Te, C—Te, Al—Te, B—Te, Ge—Te, As—Ge—Se—Si or from As—Ge—Se—Te. The active selector layer 1012 is for example doped with N, C, O, P or H. The thickness of the selector layer 1012 is for example from 15 to 50 nm.

The properties of the selector, such as its threshold voltage or its holding intensity, can be adjusted by the thickness and the composition of the active selector layer 1012.

The active selector layer 1012 can be sandwiched between two carbon layers. The carbon layers have for example a thickness from 3 to 15 nm.

The material used for the electrodes 1011, 1013, 1015 is for example TiN, TaN, W, Cu, TiWN, TiSiN or WN. The electrodes 1011, 1013, 1015 can all be comprised from the same material or be composed of different materials.

The breakdown layer 103 can be formed between the lower memory electrode 1013 and the upper selector electrode 1013 if these two electrodes are not confounded.

The cell 100 can also comprise a lower electrode separate from the lower selector electrode 1011 and/or an upper electrode 1020 separate from the upper memory electrode 1015. In this case, according to a first alternative embodiment, the breakdown layer 103 is for example formed between the upper electrode 1020 and the upper memory electrode 1015 or according to a second alternative embodiment, between the lower electrode and the lower selector electrode 1011.

The thickness of the breakdown layer 103 depends on a breakdown voltage chosen in such a way as to allow for the permanent breakdown of the dielectric material of the breakdown layer 103 when it is applied to the cell 100.

The breakdown voltage is greater than or equal to a reading voltage chosen for the cell 100.

The term "reading voltage" means the voltage applied to the cell 100 in order to read the state of the resistive memory 102 of the cell. The reading voltage is greater than the threshold voltage of the memory 102 and the threshold voltage of the selector device 101.

The breakdown voltage is also less than or equal to a programming voltage at least equal to the sum of the threshold voltage of the memory 102 and of the threshold voltage of the selector device 101.

The breakdown layer 103 is for example made from silicon dioxide $SiO_2$, titanium dioxide $TiO_2$, hafnium dioxide $HfO_2$ or nickel dioxide $NiO_2$.

Each dielectric material has a breakdown field, expressed in V/cm. Silicon dioxide $SiO_2$ has for example a breakdown field of $7 \times 10^6$ V/cm when it is deposited by PVD at ambient temperature.

The thickness of the breakdown layer 103 depends for example on the breakdown field of the dielectric material that composes the breakdown layer 103. The thickness of the breakdown layer 103 is for example the ratio of the breakdown voltage and of the breakdown field of the dielectric material.

Figure 12:
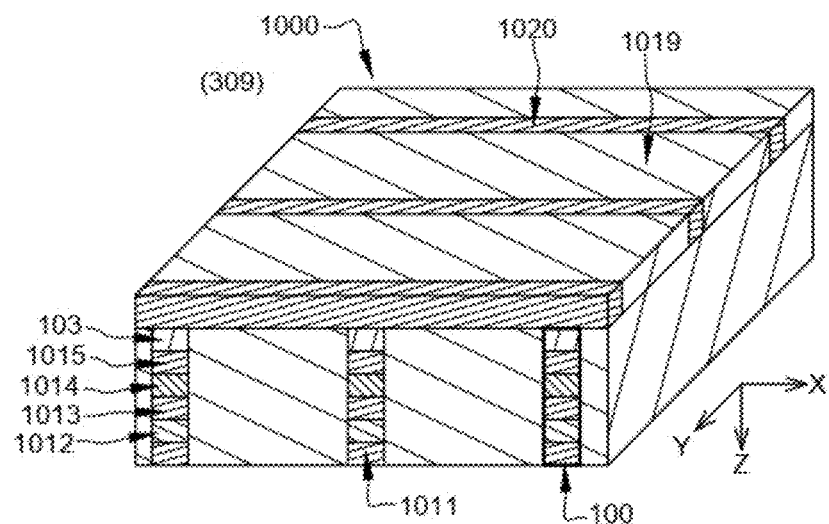
FIG. 12 diagrammatically shows the ninth step of the method of manufacturing making it possible to obtain a matrix according to the second aspect of the invention.

[FIG. 12] A second aspect of the invention relates to a matrix 1000 shown in FIG. 12 comprising a plurality of elementary cells 100 according to the first aspect of the invention.

The matrix 1000 is an architecture of the cross-bar type, i.e. it has a plurality of upper access lines 1020 or access lines, a plurality of lower access lines 1011 or access columns and a cell 100 at each intersection between an upper access line 1020 and a lower access line 1011.

The matrix 1000 thus forms a network where each cell 100 can be addressed individually, by polarising the lower access line 1011 and the upper access line 1020 that the cell 100 intersects.

Figure 17:
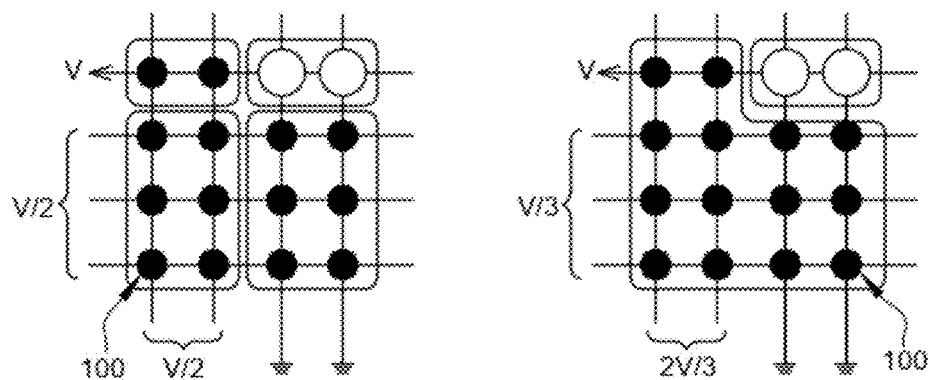
FIG. 17 shows the residual voltages exerted on addressed cells in a cross-bar architecture with a polarisation strategy in V/2 on the left and in V/3 on the right.

FIG. 17 shows two polarisation strategies to address cells 100 in an architecture of the cross-bar type.

The first strategy shown on the left consists of polarising the access line of the cells 100 to be addressed with the desired voltage V, of grounding the access columns of the cells 100 and in polarising the other access lines and columns with a voltage equal to V/2.

The second strategy shown on the right consists of polarising the access line of the cells 100 to be addressed with the desired voltage V, of grounding the access columns of the cells 100, of polarising the other lines with a voltage equal to V/3 and the other access columns with a voltage equal to 2V/3.

These polarisation strategies create residual voltages equal to the difference between the voltage exerted on the access line and the voltage exerted on the access column. Thus, for the first strategy, the cells 100 located on the same access line or on the same access columns as the addressed cells 100 have a residual voltage equal to V/2. For the second strategy, all the cells 100 shown other than the addressed cells have a residual voltage equal to V/3.

Thus, the breakdown voltage is also greater than or equal to the residual voltage exerted on the neighbouring cells 100 on the cell 100 in order to prevent the involuntary breakdown of non-addressed neighbouring cells 100.

Take the example of an active selector layer 1012 made of AsTeAlN that has a thickness of 50 nm that makes it possible to obtain a selector device 101 that has a threshold voltage of 3 V, of an active memory layer 1014 made of GST 225 that has a thickness of 50 nm making it possible to obtain a PCM memory that has a threshold voltage of 1 V and a breakdown layer 103 made of $SiO_2$ that has a breakdown field of 7 MV/cm. The polarisation strategy is of the V/2 type.

As stated hereinabove, the breakdown voltage has to be less than or equal to the programming voltage equal to the sum of the threshold voltages, i.e. 4 V and the breakdown voltage is greater than or equal to the reading voltage, itself greater than the threshold voltage of the selector device 101, i.e. 3 V, to the threshold voltage of the memory 102, i.e. 1 V, as well as to the residual voltage, i.e. 2 V by considering the maximum voltage applied during the addressing, namely the programming voltage.

If a reading voltage of 3.5 V is chosen, the breakdown voltage is between 3.5 and 4 V.

Once the breakdown voltage is chosen, considering the case where the thickness of the breakdown layer 103 is the ratio of the breakdown voltage and of the breakdown field of the dielectric material, the thickness of the breakdown layer 103 is between 5 and 5.7 nm.

Figure 13:
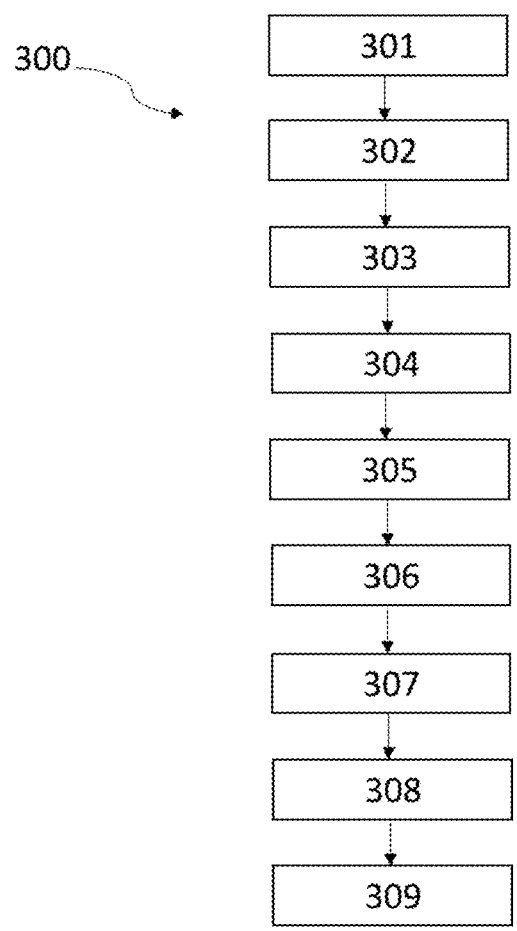
FIG. 13 shows a block diagram that shows the sequence of the steps of the method of manufacturing a matrix according to the second aspect of the invention.

FIG. 13 is a block diagram that shows the sequence of the steps 301 to 309 of a method 300 of manufacturing the matrix according to the second aspect of the invention.

Figure 4:
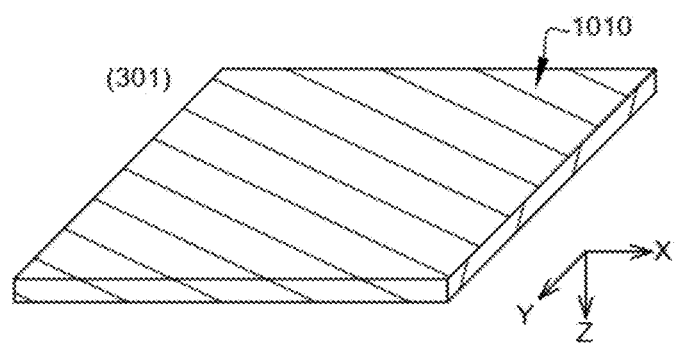
FIG. 4 diagrammatically shows the first step of the method of manufacturing.

FIG. 4 shows the first step 301 of the method 300, which consists of performing a conformal deposition of a first layer of dielectric material 1010. A conformal deposition means that the material is deposited uniformly over an entire surface. The plane according to which the first layer of dielectric material 1010 extends contains the direction $\vec{X}$ and the direction $\vec{Y}$. The orthogonal system $(\vec{X}; \vec{Y}; \vec{Z})$ defines the sides of the matrix 1000 if it is of a rectangle parallelepiped shape. The dimension of the layers according to the direction Z is called thickness.

The dielectric material of the first layer of dielectric material 1010, as the materials of the other layers of dielectric material except the breakdown layer 103, is for example SiN, $SiO_2$, SiC, SiON, SiCN or SiHN. The deposition of this step 301 as those of the following deposition steps can be a physical vapour deposition (PVD), a chemical vapour deposition (CVD), or an atomic layer deposition (ALD).

Figure 5:
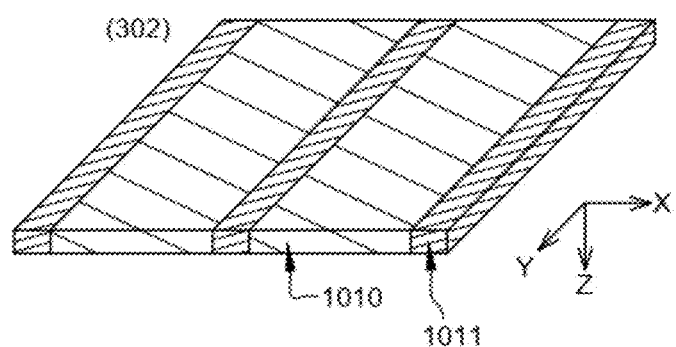
FIG. 5 diagrammatically shows the second step of the method of manufacturing.

FIG. 5 shows the second step 302 of the method 300 consisting of carrying out a damascene of the first layer of dielectric material 1010.

The term "damascene" means the method consisting of filling with conductive material a trench formed beforehand in a dielectric material followed by mechanical-chemical polishing.

The damascene is for example made with copper Cu.

Thus, the first layer of dielectric material 1010 comprises lower metal lines 1011, exposed making it possible to establish metal contacts with an upper layer.

The lower metal lines constitute the lower electrodes or the lower selector electrodes 1011 of the elementary cells 100 of the matrix 1000.

Figure 6:
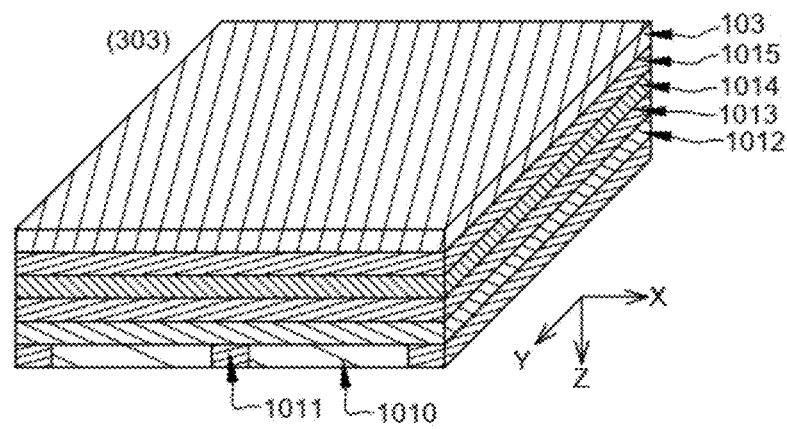
FIG. 6 diagrammatically shows the third step of the method of manufacturing.

FIG. 6 shows the third step 303 of the method 300 consisting of carrying out a conformal deposition of an active selector layer 1012, then a conformal deposition of a layer of conductive material 1013 forming both the upper selector electrode and the lower memory electrode, then a conformal deposition of an active memory layer 1014, then a conformal deposition of a layer of conductive material of upper memory electrode 1015.

In the case where the upper selector electrode is separate from the lower memory electrode, the third step 303 of the method 300 comprises the conformal deposition of an active selector layer 1012, then a conformal deposition of a first layer of conductive material forming the upper selector electrode, then of a second layer of conductive material forming the lower memory electrode, followed by a conformal deposition of an active memory layer 1014, then a conformal deposition of a layer of conductive material of upper memory electrode 1015.

In the first alternative embodiment for the breakdown layer 103 shown in FIG. 3, the third step 103 comprises a conformal deposition of a breakdown layer 103 on the layer of conductive material of upper memory electrode 1015.

In the second alternative embodiment for the breakdown layer 103 not shown in the figures, the third step 103 comprises a conformal deposition of a breakdown layer 103 on the first layer of dielectric material 1010 comprising lower metal lines 1011 then a conformal deposition of a layer of conductive material forming the lower selector electrode 1011.

The third step 303 of the method 300 can comprise, additionally, a conformal deposition of a first carbon layer on the first layer of dielectric material 1010 comprising lower metal lines 1011 and of a second carbon layer on the active selector layer 1012 in such a way that the active selector layer 1012 is sandwiched between the first and the second carbon layer.

Figure 7:
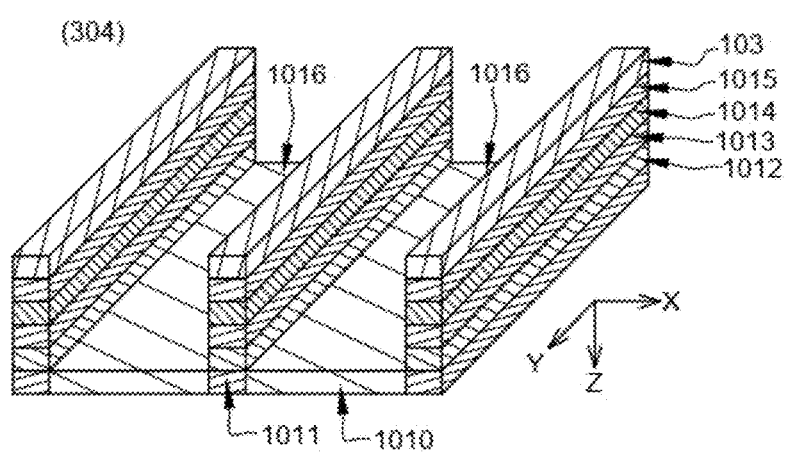
FIG. 7 diagrammatically shows the fourth step of the method of manufacturing.

FIG. 7 shows the fourth step 304 of the method 300 consisting of etching at least one first trench 1016 with stoppage on the first layer of dielectric material 1010.

The etching is for example carried out by photogravure or by lithography.

The first trench 1016 extends according to its length in the direction $\vec{Y}$. The first trench 1016 is etched in such a way that the non-etched portions are substantially of the same height after etching. In case of a plurality of first trenches 1016, the first trenches 1016 are all parallel with one another and the etching depth is the same for all the first trenches 1016.

Figure 8:
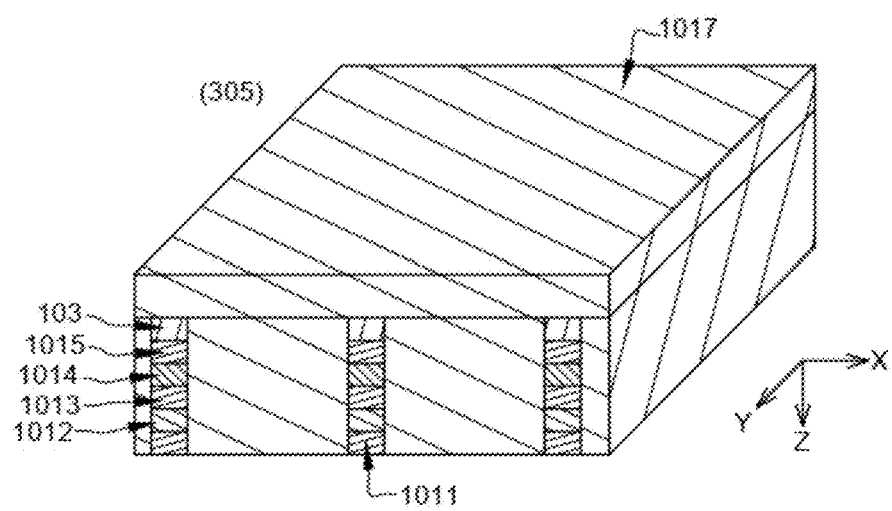
FIG. 8 diagrammatically shows the fifth step of the method of manufacturing.

FIG. 8 shows the fifth step 305 of the method 300 consisting of encapsulating the stack of FIG. 7. More precisely, this fifth step 305 consists of filling the first trenches 1016 etched beforehand and in covering the portions of the layers deposited in the third step 303 that were not etched in the preceding step of etching 304, with a second layer of dielectric material 1017.

Figure 9:
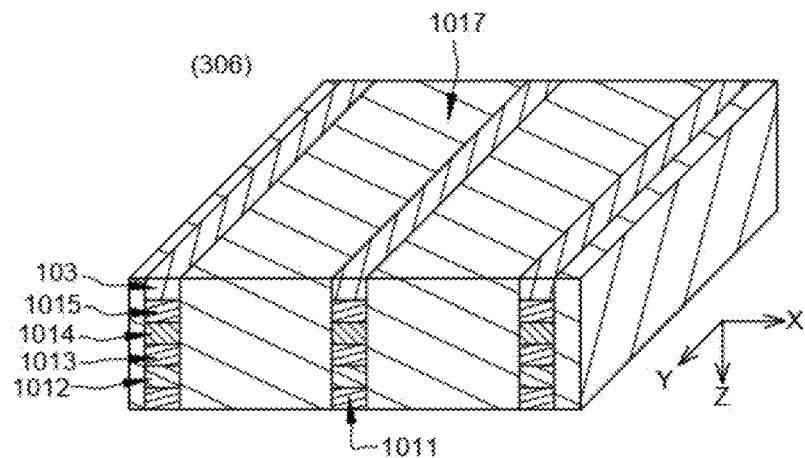
FIG. 9 diagrammatically shows the sixth step of the method of manufacturing.

FIG. 9 shows the sixth step 306 of planarization of the method 300 consisting of removing material with stoppage on the portions of the layers deposited in the third step 303 that were not etched during the step of etching 304 in such a way as to obtain a flat layer, in a plane containing the directions $\vec{X}$ and $\vec{Y}$. The planarization is for example carried out by planarizing polishing.

Figure 10:
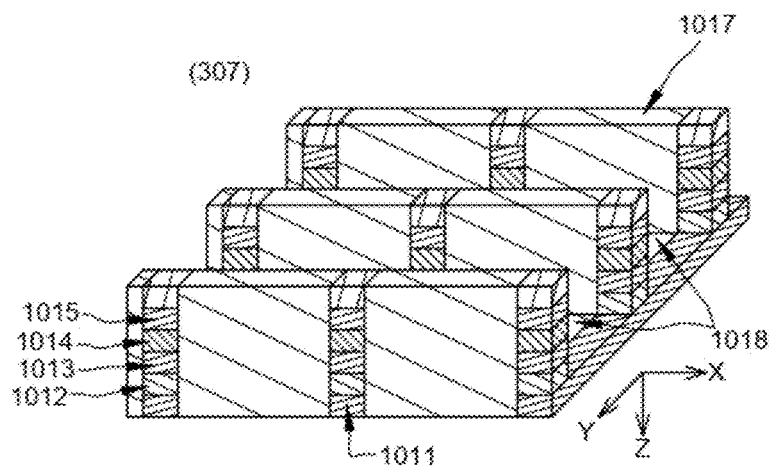
FIG. 10 diagrammatically shows the seventh step of the method of manufacturing.

FIG. 10 shows the seventh step 307 of the method 300 consisting of etching at least one second trench 1018 in one direction, here along $\vec{X}$, perpendicular to $\vec{Y}$, with stoppage on the first layer of dielectric material 1010.

In case of a plurality of second trenches 1018, the second trenches 1018 are parallel with one another and the etching depth is substantially the same for all the second trenches 1018. The second trench 1018 is etched in such a way that the non-etched portions are substantially of the same height after etching. The second trench 1018 extends, according to its length, perpendicularly to the first trench 1016, i.e. according to the axis $\vec{X}$.

Figure 11:
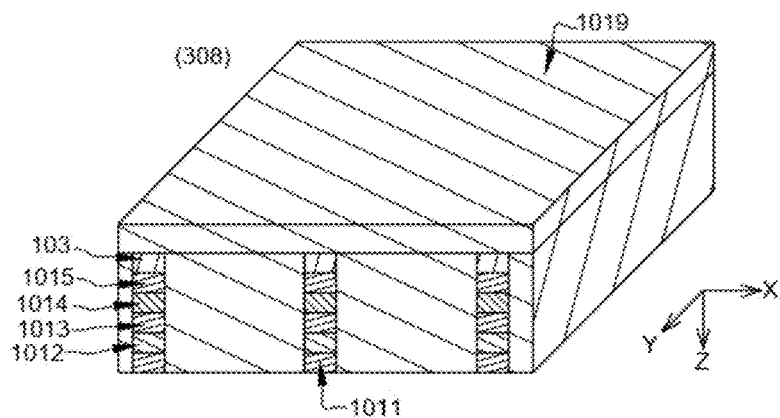
FIG. 11 diagrammatically shows the eighth step of the method of manufacturing.

FIG. 11 shows the eighth step 308 of the method 300 consisting of encapsulating the stack shown in FIG. 10. This eighth step 308 consists of filling the second trenches 1018 etched hereinabove and in covering the portions of the layers deposited in the third step 303 that were not etched in the steps of etching 304, 308, with a third layer of dielectric material 1019.

FIG. 12 shows the ninth step 309 of the method 300 consisting of carrying out a damascene of the third layer of dielectric material 1019 in order to form upper metal lines 1020.

At the end of the method 300 of manufacturing, the matrix 1000 comprises a plurality of elementary cells 100 that each have a device 101 intended to form a selector but not playing the role of selector, and a non-initialised memory 102.

Figure 14:
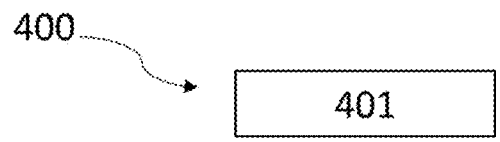
FIG. 14 shows a block diagram that shows the step of the method of initialisation according to the third aspect of the invention.

FIG. 14 is a block diagram of a method 400 for initialising according to a third aspect of the invention of a cell according to the first aspect of the invention or each cell of a matrix 1000 according to the second aspect of the invention.

A step 401 of the method 400 consists of applying a voltage pulse and an initialisation current to each elementary cell 100 in order to break down the breakdown layer 103 of each elementary cell 100 and to initialise the memory 102. The voltage pulse is equal to the breakdown voltage and the breakdown voltage is therefore chosen to ensure the initialisation or forming of the memory 102.

In the case where the active selector layer 1012 is in a conductive state after the manufacturing process, the step 401 of the method 400 can also make it possible to amorphize the active selector layer 1012 of each elementary cell 100. For this, the initialisation current has to be chosen to allow for the melting of the active selector layer 1012, and the pulse has a fall time chosen to allow for the quench of the active selector layer 1012.

The term "fall time of a pulse" means the time required for the pulse switches from 90% of its maximum value to 10% of its maximum value.

The pulse is for example a rectangular pulse that has a duration of 1 microsecond and an intensity equal to the breakdown voltage chosen. The impulsion is for example a standard programming pulse.

The pulse current is for example chosen so that the current density applied to the active selector layer 1012 is about $20 \times 10^6$ A/cm$^2$.

Figure 15:
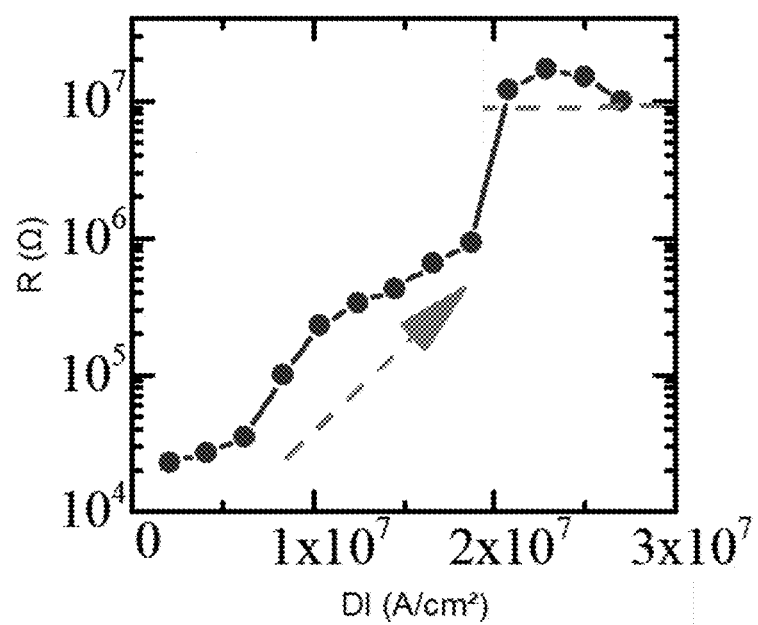
FIG. 15 shows a curve that shows the resistance of the active selector layer of a cell versus the current density that is applied to it, each point being measured after the application of a rectangular pulse that has a duration of 1 microsecond.

FIG. 15 shows the resistance R of the active selector layer 1012 versus the current density DI that is applied to it, with each point corresponding to the application of a rectangular pulse that has a duration of 1 microsecond. In FIG. 15, the resistance of the active selector layer 1012, i.e. its amorphization rate increases until reaching a level around $20 \times 10^6$ A/cm$^2$. Thus, by applying a rectangular pulse that has a duration of 1 microsecond and a current density of $20 \times 10^6$ A/cm$^2$ to the active selector layer 1012, the latter is completely amorphized.

At the end of the step 401 of the method 400, the active selector layer 1012 of each cell 100 is in an amorphous state and therefore the selector device 101 of each cell 100 is in its high resistance state OFF.

Figure 16:
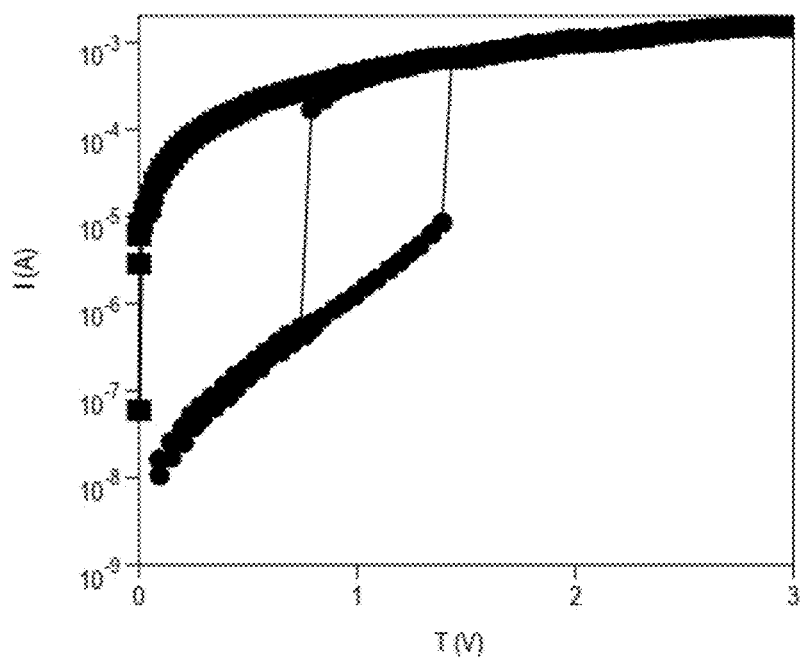
FIG. 16 shows the intensity passing through the active selector layer of an elementary cell versus the voltage that is applied to it before and after the initialisation.

FIG. 16 shows the intensity passing through the active selector layer 1012 of an elementary cell 100 versus the voltage that is applied to it before and after the amorphization of the active selector layer. Before the amorphization, the active selector layer 1012 behaves as a conductive material, i.e. having a resistance less than $1 \times 10^6 \Omega$, and after amorphization, the active selector layer 1012 behaves as a selector device, as shown in FIG. 2.

Thus, after amorphization, the selector device 101 operates as a selector and the matrix 1000 is then operational.

The invention claimed is:

1. Elementary cell comprising a device and a non-volatile resistive memory mounted in series, the device comprising:
    an upper selector electrode,
    a lower selector electrode,
    a layer made in a first active material, referred to as active selector layer, and in direct physical contact with both the upper selector electrode and the lower selector electrode,
said device being adapted to form a volatile selector switching from a first selector resistive state to a second selector resistive state by application of a selector threshold voltage between the upper selector electrode and the lower selector electrode and switching back to the first selector resistive state as soon as the current passing through it or the voltage at the terminals of the upper selector electrode and the lower selector electrode again become respectively less than a holding current or voltage, the first selector resistive state being more resistive than the second selector resistive state, said memory comprising:
    an upper memory electrode,
    a lower memory electrode,
    a layer made in at least one second active material, referred to as active memory layer, and in direct physical cal contact with both the upper memory electrode and the lower memory electrode,
said memory switching from a first resistive memory state to a second resistive memory state by application of a memory threshold voltage or current between the upper memory electrode and the lower memory electrode,
said cell further comprising a breakdown layer of dielectric material mounted in series with the device and the memory, having a thickness that allows for the breakdown of the breakdown layer at a predetermined breakdown voltage when said breakdown voltage is applied between the upper memory electrode and the lower selector electrode, wherein the breakdown layer is in direct physical contact neither with the active memory layer, nor with the active selector layer, wherein the predetermined breakdown voltage is greater than or equal to a reading voltage applied to the cell to read a state of the non-volatile resistive memory, the breakdown voltage forming a permanent breakdown of the dielectric material when the breakdown voltage is applied to the cell.

2. The cell according to claim 1, wherein the thickness of the breakdown layer is the ratio of the breakdown voltage and of a breakdown field of the dielectric material of the breakdown layer.

3. The cell according to claim 1, wherein the breakdown voltage is between the reading voltage chosen greater than the selector threshold voltage and the memory threshold voltage, and a programming voltage at least equal to the sum of the selector threshold voltage and of the memory threshold voltage.

4. The cell according to claim 1, wherein the device is adapted to form a selector of the OTS type.

5. The cell according to claim 1, wherein the resistive memory is of the PCRAM, OxRAM or CBRAM type.

6. The cell according to claim 1, wherein the active selector layer is in a crystalline conductive state.

7. The cell according to claim 6, wherein the active selector layer is in a crystalline conductive state after the manufacturing process.

8. The cell according to claim 1, wherein the upper selector electrode is confounded with the lower memory electrode.

9. The cell according to claim 1, wherein the breakdown layer is formed between the lower memory electrode and the upper selector electrode.

10. The cell according to claim 1, further comprising an upper cell electrode and/or a lower cell electrode and wherein the breakdown layer is formed between the upper cell electrode and the upper memory electrode or between the lower cell electrode and the lower selector electrode.

11. The cell according to claim 1, further comprising a carbon layer between the lower selector electrode and the active selector layer and/or between the upper selector electrode and the active selector layer.

12. A matrix comprising a plurality of cells according to claim 1, a plurality of upper access lines and a plurality of lower access lines, each cell being located at an intersection between an upper access line and a lower access line allowing for the individual addressing thereof, the neighbouring cells of the addressed cell being subjected to a residual voltage coming from the addressed cell.

13. A method for initialising a cell according to claim 1, comprising a step of applying to the cell an initialisation current and a voltage pulse having an intensity equal to the breakdown voltage.

14. The method for initialising according to claim 13, wherein, if the active selector layer is in a crystalline conductive state, the pulse has a predetermined fall time and the initialisation current has a predetermined value.

15. The method for initialising according to claim 13, wherein the breakdown voltage is between a minimum breakdown voltage equal to the maximum voltage between the reading voltage and the residual voltage, and a maximum breakdown voltage equal to the programming voltage.

* * * * *